(12) United States Patent
Ishizuka et al.

(10) Patent No.: US 6,429,837 B1
(45) Date of Patent: Aug. 6, 2002

(54) METHOD OF DRIVING A LUMINESCENT DISPLAY

(75) Inventors: Shinichi Ishizuka; Yoshinori Fukuda; Satoshi Miyaguchi; Hideo Ochi; Taizo Ishida; Masami Tsuchida, all of Saitama-ken (JP)

(73) Assignee: Pioneer Electronic Corporation, Tokyo (JP)

( * ) Notice: Subject to any disclaimer, the term of this patent is extended or adjusted under 35 U.S.C. 154(b) by 0 days.

(21) Appl. No.: 09/289,656

(22) Filed: Apr. 12, 1999

(30) Foreign Application Priority Data

Apr. 21, 1998 (JP) .............................................. 10-126895

(51) Int. Cl.[7] ................................................. G09G 3/22
(52) U.S. Cl. ......................... 345/74.1; 345/78; 345/208
(58) Field of Search .............................. 345/76, 78, 82, 345/85, 208, 74.1

(56) References Cited

U.S. PATENT DOCUMENTS

| 4,594,589 A | * | 6/1986 | Ohba et al. |
| 4,975,691 A | * | 12/1990 | Lee |
| 5,962,983 A | * | 10/1999 | Anderson et al. |

* cited by examiner

Primary Examiner—Kent Chang
(74) Attorney, Agent, or Firm—Arent Fox Kintner Plotkin & Kahn

(57) ABSTRACT

A method is provided for driving a luminescent display which includes a plurality of luminescent units adapted to be selected for light emission, so as to display an image. This method is characterized in that during a predetermined period, a reverse voltage having a direction opposite to that of a voltage to be applied for light emission of a luminescent unit, is applied to each luminescent unit.

11 Claims, 7 Drawing Sheets

METHOD OF DRIVING A LUMINESCENT DISPLAY

BACKGROUND OF THE INVENTION

The present invention relates to a method of driving a luminescent display which can perform picture displaying with the use of an organic EL (Electro Luminescent) unit.

There has been known a conventional luminescent display which can perform picture displaying with the use of a plurality of luminescent units such as organic EL units. Such kind of conventional luminescent display includes a plurality of anode lines and a plurality of cathode lines, arranged in a matrix array to form a lattice pattern. A plurality of luminescent units are connected at a plurality of intersections formed by the anode lines with the cathode lines.

Each luminescent unit connected at one of the above intersections may be represented by an equivalent circuit shown in FIG. 7, including a light emitting element E having a function as a diode, and a condenser device C connected to the element E. In this way, such a luminescent unit can emit a light only when an electric current flows in a forward direction through the light emitting element E (functioning as a diode).

Further, as shown in FIG. 6, each luminescent unit includes a transparent substrate plate 101, successively laminated on the transparent substrate plate 101 is an anode (transparent electrode) 102, a luminescent layer 103, a cathode (metal electrode) 104. Once an electric current serving as a driving source is supplied to the anode 102 and the cathode 104 is connected to the earth, the electric current will flow through the luminescent layer 103, thereby enabling the luminescent unit to emit a light.

However, with the above-discussed conventional luminescent display, if the luminescent layer 103 involves a small-thickness portion or if the luminescent layer 1033 is partially so thin that it fails to serve as a separator between the anode 102 and the cathode 104, a problem called short circuit will occur between the anode 102 and the cathode 104, causing a leaked current and hence failing to enable the luminescent unit to emit a light in a predetermined desired manner.

In more detail, if the luminescent layer 103 involves a small-thickness portion, an electric resistance will become small at this portion so that a driving current will be collected in this small-thickness portion, resulting in a problem that there will be only a small electric current flowing through other portions of the luminescent layer 3, and hence causing a low light emission brightness on other portions of the luminescent layer 103.

Further, a short circuit will affect other luminescent units on an identical cathode line, causing the entire display to be unable to clearly display a picture.

SUMMARY OF THE INVENTION

It is an object of the present invention to provide an improved luminescent display capable of greatly reducing inferior luminescence as compared with a conventional display, so as to solve the above-mentioned problems peculiar to the above-mentioned prior art.

According to a first aspect of the present invention, there is provided a method of driving a luminescent display, said display including a plurality of anode lines and a plurality of cathode lines, a plurality of luminescent units connected at a plurality of intersections formed by the anode lines with the cathode lines, the anode lines (or the cathode lines) being used as scanning lines while the cathode lines (or the anode lines) being used as driving lines, in a manner such that when the scanning lines are being scanned, some of the driving lines are connected to driving sources in accordance with such scanning, so as to enable the luminescent units to emit lights, said method being characterized in that: during a predetermined period, a reverse voltage having a direction opposite to that of a voltage to be applied for light emission of a luminescent unit, is applied to each luminescent unit.

According to a second aspect of the present invention, there is provided a method of driving a luminescent display, said display including a plurality of anode lines and a plurality of cathode lines, a plurality of luminescent units connected at a plurality of intersections formed by the anode lines with the cathode lines, the anode lines (or the cathode lines) being used as scanning lines while the cathode lines (or the anode lines) being used as driving lines, in a manner such that when the scanning lines are being scanned, some of the driving lines are connected to driving sources in accordance with such scanning, so as to enable the luminescent units to emit lights, said method being characterized in that: the driving lines are connected to the driving sources when the luminescent units are caused to emit lights, but connected to an earth potential when the luminescent units are not caused to emit lights; the scanning lines are connected to earth means when the scanning lines are scanned, but connected to a constant voltage source when the scanning lines are not scanned; during a predetermined period, a reverse voltage having a direction opposite to that of a voltage to be applied for light emission of a luminescent unit, is applied to each luminescent unit.

In the second aspect of the present invention, the reverse voltage is applied by connecting the scanning lines to the constant voltage source and connecting the driving lines to the earth potential.

According to a third aspect of the present invention, there is provided a method of driving a luminescent display, said display including a plurality of anode lines and a plurality of cathode lines, a plurality of luminescent units connected at a plurality of intersections formed by the anode lines with the cathode lines, the anode lines (or the cathode lines) being used as scanning lines while the cathode lines (or the anode lines) being used as driving lines, in a manner such that when the scanning lines are being scanned, some of the driving lines are connected to driving sources in accordance with such scanning, so as to enable the luminescent units to emit lights, said method being characterized in that: the driving lines are connected to the driving sources when the luminescent units are caused to emit lights, but connected to an earth potential when the luminescent units are not caused to emit lights; the scanning lines are connected to earth means when the scanning lines are scanned, but connected to a constant voltage source when the scanning lines are not scanned; during a predetermined period from the end of a scanning of one frame until a shift into a scanning of a next frame, a reverse voltage having a direction opposite to that of a voltage to be applied for light emission of a luminescent unit, is applied to each luminescent unit.

In the third aspect of the present invention, during said predetermined period, each of the scanning lines is connected to a constant voltage source, while each of the driving lines is connected to an earth potential. Further, said predetermined period is allowed to be equal to a scanning period of one scanning line.

According to a fourth aspect of the present invention, there is provided a method of driving a luminescent display, said display including a plurality of anode lines and a plurality of cathode lines, a plurality of luminescent units connected at a plurality of intersections formed by the anode lines with the cathode lines, the anode lines (or the cathode lines) being used as scanning lines while the cathode lines (or the anode lines) being used as driving lines, in a manner such that when the scanning lines are being scanned, some of the driving lines are connected to driving sources in accordance with such scanning, so as to enable the luminescent units to emit lights, said method being characterized in that: the driving lines are connected to the driving sources when the luminescent units are caused to emit lights, but connected to an earth potential when the luminescent units are not caused to emit lights; the scanning lines are connected to earth means when the scanning lines are scanned, but connected to a constant voltage source when the scanning lines are not scanned; during a predetermined period from the end of a scanning of one scanning line until a shift into a scanning of a next scanning line, a reverse voltage having a direction opposite to that of a voltage to be applied for light emission of a luminescent unit, is applied t[]o each luminescent unit.

In the fourth aspect of the present invention, during said predetermined period, each of the scanning lines is connected to a constant voltage source, while each of the driving lines is connected to an earth potential.

According to a fifth aspect of the present invention, there is provided a method of driving a luminescent display which includes a plurality of luminescent units adapted to be selected for light emission, so as to display an image, said method being characterized in that: at a moment when an electric power is supplied to the luminescent display, a reverse voltage having a direction opposite to that of a voltage to be applied for light emission of a luminescent unit is applied to each luminescent unit.

In any one of the above first to fifth aspects of the present invention, each of the luminescent units has a diode characteristic which can perform a light emission only in response to a voltage applied in one direction.

Further, in any one of the above first to fifth aspects of the present invention, each of the luminescent units contains an organic EL (electro luminescent) material.

The above objects and features of the present invention will become better understood from the following description with reference to the accompanying drawings.

DETAILED DESCRIPTION OF THE PREFERRED EMBODIMENTS

Figure 6:
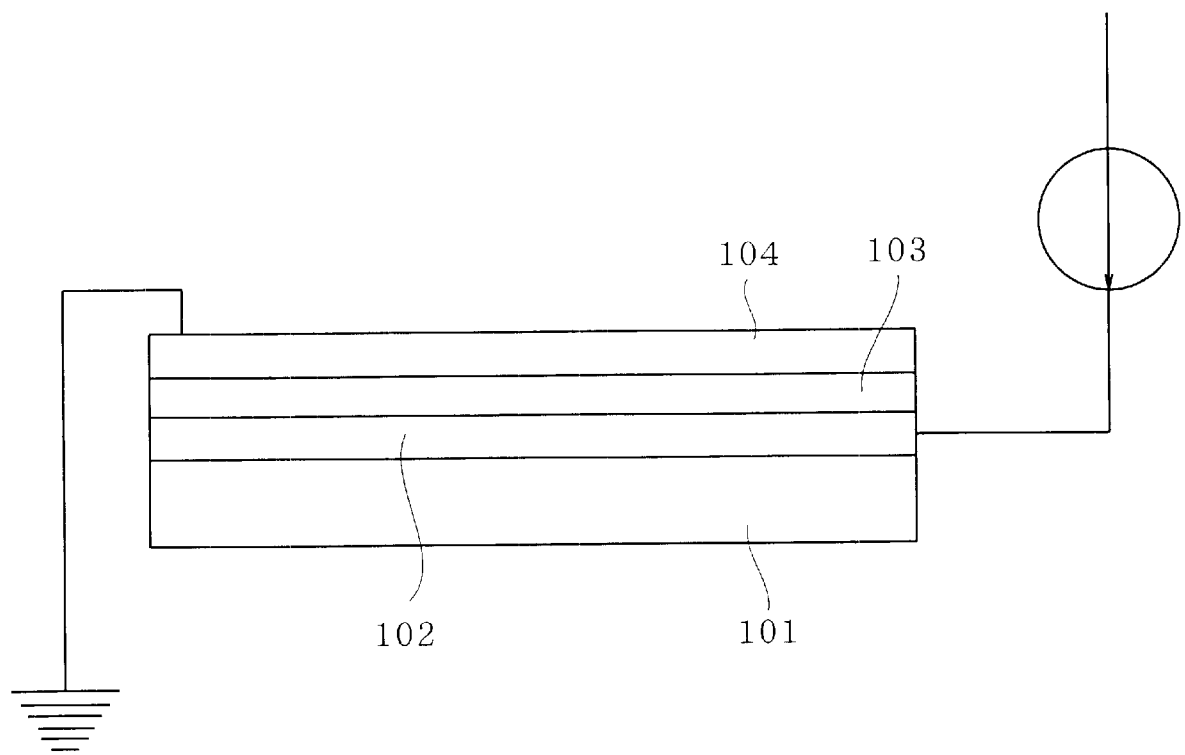
FIG. 6 is an explanatory view schematically indicating the structure of a luminescent unit made according to a prior art.
Figure 7:
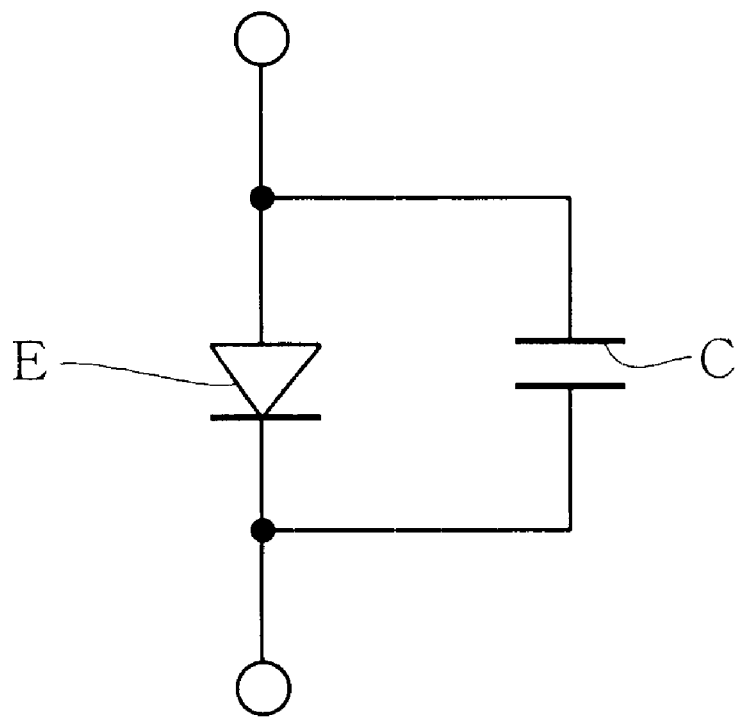
FIG. 7 is an explanatory view indicating an equivalent circuit of a luminescent unit.

Some necessary explanations in relation to the present invention will be made with reference to FIGS. 1–3 in which the same elements as those in the above FIGS. 6 and 7 will be represented by the same reference numerals.

Figure 1:
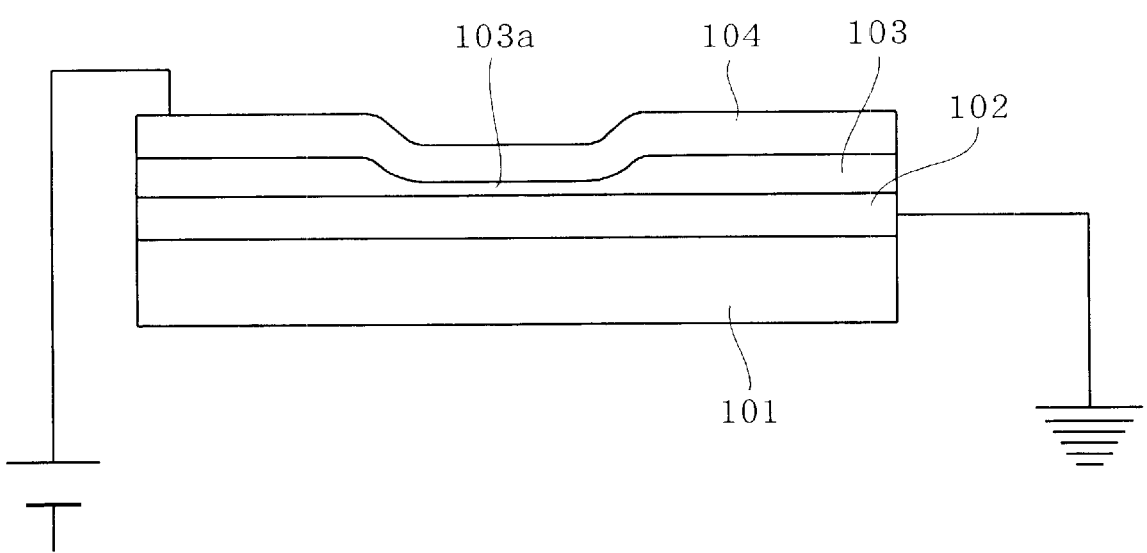
FIG. 1 is an explanatory view schematically indicating the structure of a luminescent unit having a small thickness portion.

Referring to FIG. 1, each luminescent unit of a luminescent display, includes a transparent substrate plate 101, successively laminated on the transparent substrate plate 101 is an anode (transparent electrode) 102, a luminescent layer 103, a cathode (metal electrode) 104. In FIG. 1, a reference numeral 103a is used to represent a small-thickness portion of the luminescent layer 103.

As explained during the discussion of the above prior art, a luminescent unit involves a light emitting element which will function as a diode, if a reverse voltage having a direction opposite to a light emitting voltage is applied to a normal luminescent unit, there will be no current flowing through the luminescent layer 103. However, if the luminescent layer 103 involves a small-thickness portion 103a having only a low electric resistance, an electric current will be collected in such small-thickness portion 103. As a result, an excessively large current, which is larger than a leak current during a light emission, will flow through the small-thickness portion 103a.

Figure 2:
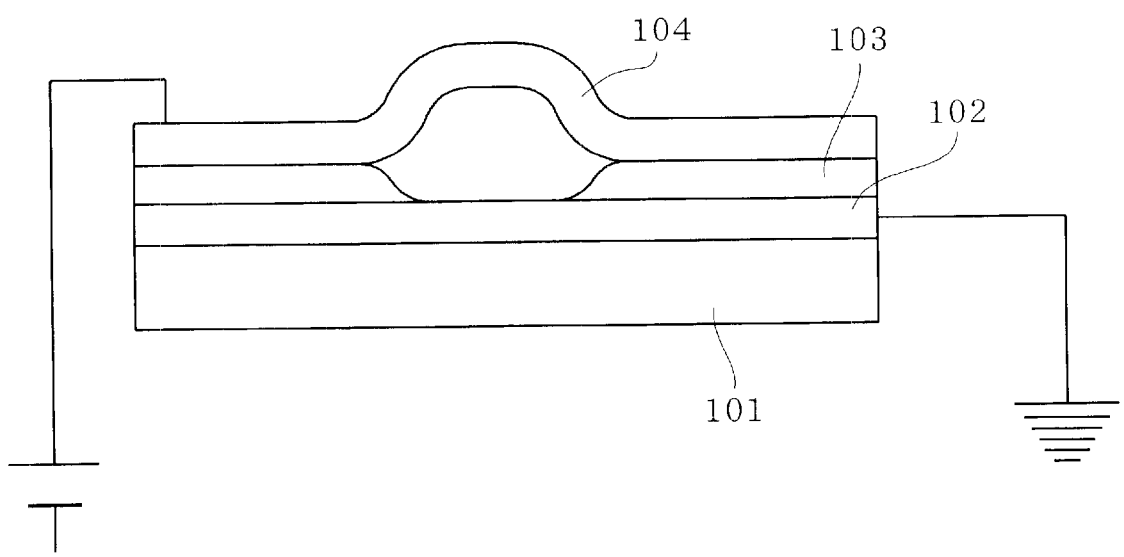
FIG. 2 is an explanatory view schematically indicating a principle as to why a leak current may be prevented.

Because of this, as shown in FIG. 2, the small-thickness portion 103 and its surrounding areas on the luminescent layer 103 is vaporized, producing an expansion pressure which tends to cause the cathode 104 to bend in a direction away from the anode 102. Moreover, if the expansion pressure is continued for a long time, the cathode 104 will be broken. Consequently, as shown in FIG. 3, the broken portions will be bent in a direction away from the anode 102.

Figure 3:
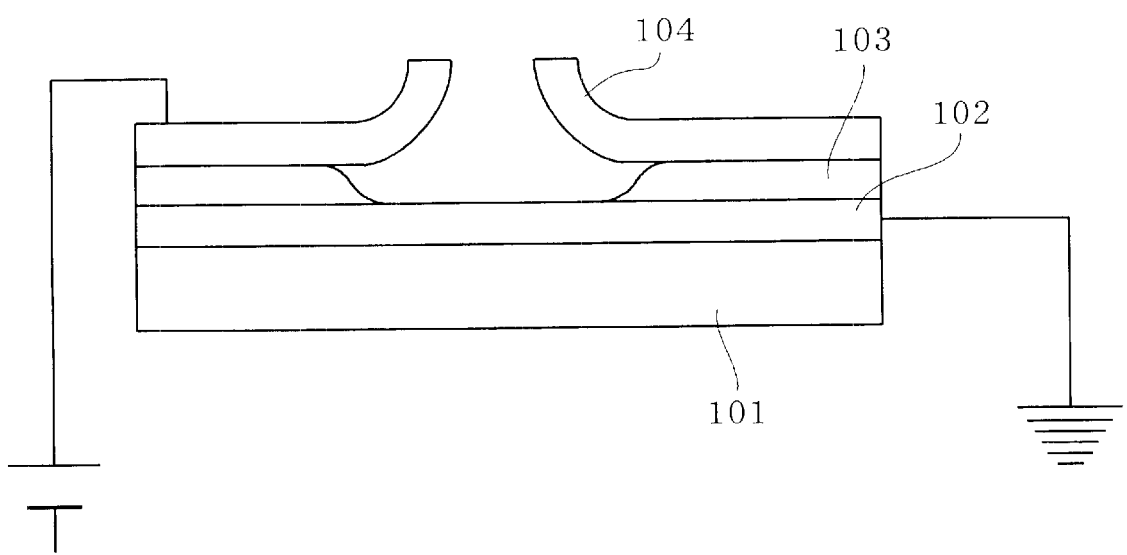
FIG. 3 is an explanatory view schematically indicating a principle as to why a leak current may be prevented.

Under a condition shown in FIG. 2 or FIG. 3, there would be no light emission in a bent or broken portion of the cathode 104. As a result, since the cathode 104 is separated from the anode 102, there would be no leak current. Therefore, it is sure that other portions of the luminescent units and other luminescent units connected with such cathode 104 shown in FIG. 2 or 3 are allowed to perform a light emission in a normal way, thereby avoiding a problem called inferior light emission which occurred in a prior art.

In general, the small-thickness portion 103a of the luminescent layer 403 is possibly caused due to dust or some small rubbish attached on the anode 102 during a manufacturing process, while a leak current possibly occurs with the passing of time and depends upon the thickness of a small-thickness portion 103a and further depends on a surrounding environment. In order to exactly avoid an inferior light emission which is possibly caused by a leak current, the present invention requires that a reverse voltage having a direction opposite to a light emitting voltage be applied periodically.

Figure 4:
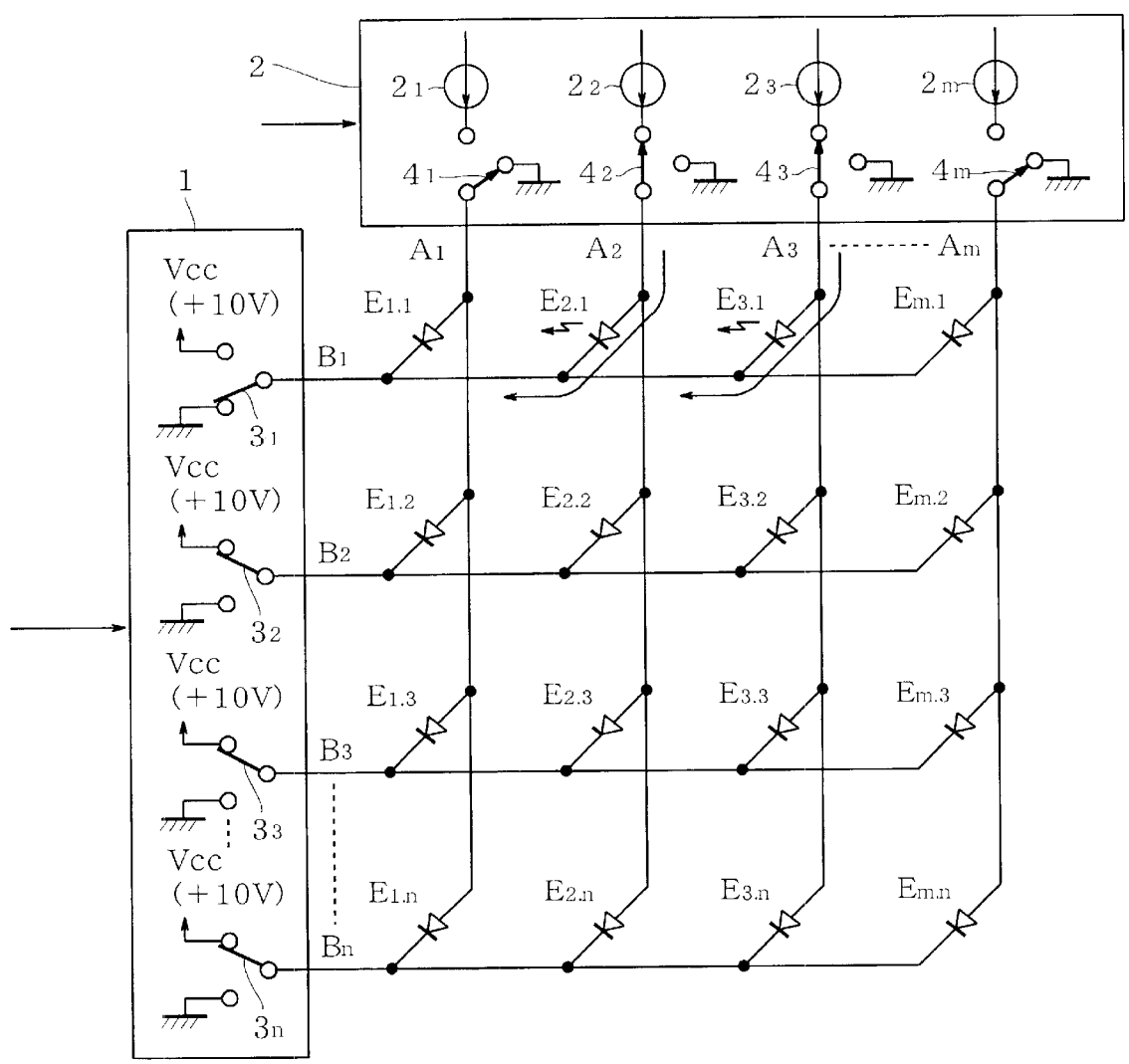
FIG. 4 is an explanatory view schematically indicating one embodiment of the present invention.

FIG. 4 is an explanatory view schematically indicating a luminescent display apparatus for use in carrying out the method of the present invention. The apparatus of FIG. 4 is however a conventional luminescent display apparatus.

The luminescent display apparatus includes a plurality of anode lines A1–Am and a plurality of cathode lines B1–Bn, arranged perpendicular to each other so as to form a lattice pattern. A plurality of luminescent units E1, 1–Em,n are connected at a plurality of metrix-arranged intersections formed by the anode lines A1–Am with the cathode lines B1–Bn. The anode lines A1–Am (or the cathode lines B1–Bn) are successively and selectively scanned at a predetermined time interval, while the cathode lines B1–Bn (or the anode lines A1–Am) are driven by a plurality of electric currents 21–2m, at a timing in synchronism with the above scanning, thereby rendering the luminescent units at any selected intersections to emit lights. In FIG. 4, the luminescent units for light emission are represented by diode marks.

As illustrated in FIG. 4, the cathode lines B1–Bn are connected to a cathode line scanning circuit 1, while the anode lines A1–Am are connected to an anode line driving circuit 2 including electric current sources 21–2m.

In the cathode line scanning circuit 1, switches 31–3n are successively changed over to an earth side at a predetermined time interval (so as to perform a predetermined scanning), thereby providing the cathode lines B1–Bn with an earth potential (0V). The anode driving circuit 2, in synchronizm with the change-over operation of the switches 31–3n of the cathode line scanning circuit 1, is actuated to perform ON/OFF control on switches 41–4m, thereby rendering the anode lines A1–Am to be connected with the electric sources 21–2m each of which is adapted to supply a stabilized constant electric current, thereby supplying driving currents to luminescent units at desired intersections.

For instance, if luminescent units E2, 1 and E3, 1 are selected to emit lights, the switch 31 of the cathode scanning circuit 1 is changed over to the earth side, providing a first cathode line B1 with an earth potential (0V). Meanwhile, the switches 42 and 43 of the anode line driving circuit 2 are changed over to the constant current source side, rendering the anode lines A2 and A3 to be connected with the constant current sources 22, 23.

At this moment, since switches 41, 44–4m are still on earth side (0V), the luminescent units E11, E4,1–Em,1 will not emit lights. Further, on each of other cathode lines B2–Bn is applied a reverse bias voltage Vcc which has the same potential as a forward voltage applied during light emission of a luminescent unit, thereby preventing the flowing of a current to the cathode lines B2–Bn and thus preventing a possible cross talk.

As a result, in the luminescent units E1,2–E1,n, E4,2–E4 n . . . Em, 2–Em, n, each anode is connected to an earth potential, while each cathode is connected to a reverse bias voltage (Vcc), thereby ensuring the application of a reverse voltage having a direction opposite to a voltage applied for light emission of a luminescent unit.

By repeating the above scanning and driving treatments at a high speed with other luminescent units, any luminescent unit at any position will emit a light, obtaining an effect as if all the luminescent units are emitting lights at the same time.

Some embodiments of the present invention for driving the above luminescent display will be described in detail bellow. According to a first embodiments, in each frame period, a reset period is provided so that each of the cathode lines B1–Bn is connected to a reverse bias potential Vcc, while each of the anode lines A1–Am is connected to an earth potential. During a frame period, each of the luminescent units E1, 1–Em,n will receive a voltage which has a direction opposite to a voltage applied during light emission of a luminescent unit.

Figure 5:
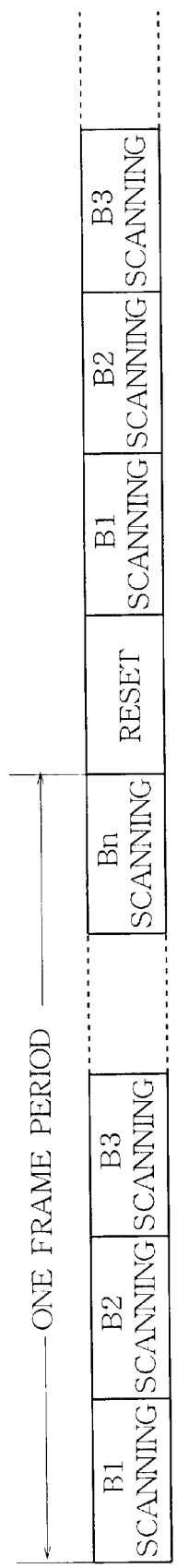
FIG. 5 is an explanatory view schematically indicating one embodiment of the present invention.

FIG. 5 is a timing chart indicating the first embodiment of the present invention. In practice, one frame period means a total period including the scanning periods of the cathode lines B1–Bn. However, in the first embodiment, a reset period is set between two frame periods. By setting such kind of a reset period, even if a leak current occurs in each of the cathode lines B1–Bn, leak positions may be repaired before the starting of a next scanning period.

A time interval of a reset period is allowed to be set as desired, but if it is set to have the same interval as each scanning period (each of B1–Bn scannings), it is sure to obtain an effect that the switches 31–3n will be easier to control.

The value of a reverse voltage may be set to be 50–200% of a voltage applied for light emission of a luminescent unit. If an applied reverse voltage is small, a situation will be like that shown in FIG. 2. On the other hand, if an applied reverse voltage is large, a situation will be like that shown in FIG. 3. Anyway, in either of the above two cases, it is sure to prevent a leak current.

The second embodiment of the present invention requires that a reset period is provided so that in each scanning period, each of the cathode lines B1–Bn is connected to a reverse bias potential Vcc, while each of the anode lines A1–Am is connected to an earth potential. Thus, during each scanning period, each of the luminescent units E1, 1–Em,n will receive a voltage having a direction opposite to a voltage applied during light emission of a luminescent unit.

In the second embodiment, since a reverse voltage is applied more frequently than in the first embodiment, it is preferred that a reset period be set shorter than a scanning period.

In both of the first and second embodiments, since a means for applying a reverse voltage in a reset period is allowed to use a reverse bias potential Vcc voltage source which has been originally provided for preventing a cross talk in non-scanning cathode lines, it is not necessary to incorporate additional element(s) into a known luminescent display, thereby making it sure to prevent a leak current without using new element(s).

In this way, the present invention may be concluded as follows. Namely, although a leak current possibly caused by a short circuit may occur in a small thickness portion of a luminescent layer, the application of a reverse voltage having a direction opposite to a voltage applied for light emission of a luminescent unit, has been proved effective in preventing such leak current.

Therefore, with the use of the method suggested by the present invention for driving a luminescent display, it is sure to avoid an inferior light emission which is possibly caused due to a leak current, thereby providing an improved luminescent display apparatus having an improved displaying quality with a higher reliability.

While the presently preferred embodiments of the this invention have been shown and described above, it is to be understood that these disclosures are for the purpose of illustration and that various changes and modifications may be made without departing from the scope of the invention as set forth in the appended claims.

What is claimed is:

1. A method of driving a luminescent display, said display including a plurality of anode lines and a plurality of cathode lines, a plurality of luminescent units connected at a plurality of intersections formed by the anode lines with the cathode lines, the anode lines (or the cathode lines) being used as scanning lines while the cathode lines (or the anode lines) being used as driving lines, in a manner such that when the scanning lines are being scanned, some of the driving lines are connected to driving sources in accordance with such scanning, so as to enable the luminescent units to emit lights, said method being characterized in that:

during the predetermined period, a reverse voltage having a direction opposite to that of a voltage to be applied for light emission of a luminescent unit, is applied to each luminescent unit, said reverse voltage is applied to luminescent units that are not to be illuminated when a forward voltage is being applied to luminescent units that are to be illuminated.

2. A method of driving a luminescent display, said display including a plurality of anode lines and a plurality of cathode lines, a plurality of luminescent units connected at a plurality of intersections formed by the anode lines with the cathode lines, the anode lines (or the cathode lines) being used as scanning lines while the cathode lines (or the anode lines) being used as driving lines, in a manner such that when the scanning lines are being scanned, some of the driving lines are connected to driving sources in accordance with such scanning, so as to enable the luminescent units to emit lights, said method being characterized in that:

the driving lines are connected to the driving sources when the luminescent units are caused to emit lights, but connected to an earth potential when the luminescent units are not caused to emit lights;

the scanning lines are connected to earth means when the scanning lines are scanned, but connected to a constant voltage source when the scanning lines are not scanned;

during a predetermined period, a reverse voltage having a direction opposite to that of a voltage to be applied for light emission of a luminescent unit, is applied to each luminescent unit, said reverse voltage is applied to luminescent units that are not to be illuminated when a forward voltage is being applied to luminescent units that are to be illuminated.

3. The method according to claim 2, wherein the reverse voltage is applied by connecting the scanning lines to the constant voltage source and connecting the driving lines to the earth potential.

4. A method of driving a luminescent display, said display including a plurality of anode lines and a, plurality of cathode lines, a plurality of luminescent units connected at a plurality of intersections formed by the anode lines with the cathode lines, the anode lines (or the cathode lines) being used as scanning lines while the cathode lines (or the anode lines) being used as driving lines, in a manner such that when the scanning lines are being scanned, some of the driving lines are connected to driving sources in accordance with such scanning, so as to enable the luminescent units to emit lights, said method being characterized in that:

the driving lines are connected to the driving sources when the luminescent units are caused to emit lights, but connected to an earth potential when the luminescent units are not caused to emit lights;

the scanning lines are connected to earth means when the scanning lines are scanned, but connected to a constant voltage source when the scanning lines are not scanned;

during a predetermined period from the end of a scanning of one frame until a shift into a scanning of a next frame, a reverse voltage having a direction opposite to that of a voltage to applied for light emission of a luminescent unit, is applied to each luminescent unit, said reverse voltage is applied to luminescent units that are not to be illuminated when a forward voltage is being applied to luminescent units that are to be illuminated.

5. The method according to claim 4, wherein during said predetermined period, each of the scanning lines is connected to a constant voltage source, while each of the driving lines is connected to an earth potential.

6. The method according to claim 5, wherein said predetermined period is allowed to be equal to a scanning period of one scanning line.

7. A method of driving a luminescent display, said display including a plurality of anode lines and a plurality of cathode lines, a plurality of luminescent units connected at a plurality of intersections formed by the anode lines with the cathode lines, the anode lines (or the cathode lines) being used as scanning lines while the cathode lines (or the anode lines) being used as driving lines, in a manner such that when the scanning lines are being scanned, some of the driving lines are connected to driving sources in accordance with such scanning, so as to enable the luminescent units to emit lights, said method being characterized in that:

the driving lines are connected to the driving sources when the luminescent units are caused to emit lights, but connected to an earth potential when the luminescent units are not caused to emit lights;

the scanning lines are connected to earth means when the scanning lines are scanned, but connected to a constant voltage source when the scanning lines are not scanned;

during a predetermined period from the end of a scanning of one line until a shift into a scanning of a next scanning line, a reverse voltage having a direction opposite to that of a voltage to be applied to each luminescent unit, said reverse voltage is applied to luminescent units that are not to be illuminated when a forward voltage is being applied to luminescent units that are to be illuminated.

8. The method according to claim 7, wherein during said predetermined period, each of the scanning lines is connected to a constant voltage source, while each of the driving lines is connected to an earth potential.

9. A method of driving a luminescent display which includes a plurality of luminescent units adapted to be selected for light emission, so as to display an image, said method being characterized in that:

at a moment when an electric power is supplied to the luminescent display, a reverse voltage having a direction opposite to that of a voltage to be applied for light emission of a luminescent unit is applied to each luminescent unit, said reverse voltage is applied to luminescent units that are not to be illuminated when a forward voltage is being applied to luminescent units that are to be illuminated.

10. The method according to claim 1, wherein each of the luminescent units has a diode characteristic which can perform a light emission only in response to a voltage applied in one direction.

11. The method according to claim 1, wherein each of the luminescent units contains an organic EL (electro luminescent) material.

* * * * *